(12) United States Patent
Yabuki et al.

(10) Patent No.: US 10,014,176 B2
(45) Date of Patent: Jul. 3, 2018

(54) SIC SUBSTRATE TREATMENT METHOD

(71) Applicant: Toyo Tanso Co., Ltd., Osaka-shi, Osaka (JP)

(72) Inventors: Norihito Yabuki, Kanonji (JP); Satoshi Torimi, Kanonji (JP); Satoru Nogami, Kanonji (JP)

(73) Assignee: TOYO TANSO CO., LTD., Osaka-shi (JP)

( * ) Notice: Subject to any disclaimer, the term of this patent is extended or adjusted under 35 U.S.C. 154(b) by 0 days.

(21) Appl. No.: 15/527,602

(22) PCT Filed: Nov. 17, 2015

(86) PCT No.: PCT/JP2015/005739
§ 371 (c)(1),
(2) Date: May 17, 2017

(87) PCT Pub. No.: WO2016/079980
PCT Pub. Date: May 26, 2016

(65) Prior Publication Data
US 2017/0323792 A1 Nov. 9, 2017

(30) Foreign Application Priority Data

Nov. 18, 2014 (JP) ................................ 2014-233233

(51) Int. Cl.
*H01L 21/00* (2006.01)
*H01L 21/04* (2006.01)
*H01L 21/306* (2006.01)

(52) U.S. Cl.
CPC .......... *H01L 21/046* (2013.01); *H01L 21/306* (2013.01)

(58) Field of Classification Search
CPC ................. H01L 21/046; H01L 21/306; H01L 21/28176; H01L 21/67115; H01L 21/67011
See application file for complete search history.

(56) References Cited

U.S. PATENT DOCUMENTS

2005/0230686 A1* 10/2005 Kojima ............. H01L 21/02024
257/77
2008/0293240 A1* 11/2008 Kawada ............. H01L 21/0475
438/652
(Continued)

FOREIGN PATENT DOCUMENTS

JP        11-87257 A       3/1999
JP      2008-016691 A      1/2008
(Continued)

OTHER PUBLICATIONS

Masuda et al., "1700 V/3.5 mΩcm2 V-groove trench MOSFETs with high threshold voltage," Sic and relevant semiconductor study group 22th conference proceedings, The Japan Society of Applied Physics, Dec. 9, 2013, p. 21-22, with English translation (4 pages).
(Continued)

*Primary Examiner* — Nikolay Yushin
(74) *Attorney, Agent, or Firm* — Westerman, Hattori, Daniels & Adrian, LLP

(57) ABSTRACT

Provided is a SiC substrate treatment method for, with respect to a SiC substrate (40) that has, on its surface, grooves (41), activating ions while preventing roughening of the surface of the substrate. In the method, an ion activation treatment in which the SiC substrate (40) is heated under Si vapor pressure is performed to the SiC substrate (40) has, on its surface, an ion implantation region (46) in which ions have been implanted, and has the grooves (41) provided in a region including at least the ion implantation region (46),
(Continued)

thereby ions that are implanted in the SiC substrate (40) is activated while etching the surface of the substrate.

12 Claims, 7 Drawing Sheets

(56) References Cited

U.S. PATENT DOCUMENTS

2015/0099350 A1* 4/2015 Srinivasan ........ H01L 21/26546
  438/522
2015/0255314 A1 9/2015 Torimi et al.

FOREIGN PATENT DOCUMENTS

| JP | 2009-188117 A | 8/2009 |
| JP | 2012-209415 A | 10/2012 |
| JP | 2014-103180 A | 6/2014 |

OTHER PUBLICATIONS

International Search Report dated Feb. 16, 2016, issued in counterpart International Application No. PCT/JP2015/005739 (2 pages).

Office Action dated Oct. 19, 2017, issued in counterpart Japanese Application No. 2016-560057, with English machine translation. (6 pages).

\* cited by examiner

SIC SUBSTRATE TREATMENT METHOD

TECHNICAL FIELD

The present invention relates to a method for heat-treating a SiC substrate having grooves, the SiC substrate that is used for manufacturing a semiconductor element.

BACKGROUND ART

SiC, which is superior to Si or the like in, for example, heat resistance and electrical characteristics, has attracted attention as a new semiconductor material.

A semiconductor device made of SiC is manufactured by using a SiC substrate with a diameter of 4-inch or 6-inch, for example. A method for isolating the semiconductor element by using grooves preformed on the SiC substrate in which ion implantation, ion activation and electrode formation, and the like are performed thereon has been conventionally known as a method for manufacturing the plurality of semiconductor elements from one SiC substrate.

The SiC substrate may have grooves for the purpose of embedding of a MOSFET gate, in addition to the purpose of isolation of the semiconductor element (see a trench gate MOSFET, NON-Patent Document 1).

Here, the SiC substrate needs to be heat-treated for activating ions after implanting ions such as Al, or the like. The heat treatment (ion activation treatment) needs to be performed at a high temperature of 1500° C. or more. However, when ion implantation treatment and ion activation treatment are performed on the SiC substrate, the surface of the SiC substrate is roughened.

Therefore, a carbon cap method in which a surface roughness of the SiC substrate is prevented by forming a carbon cap on the SiC substrate is used. In the carbon cap method, a resist is applied on the surface of the SiC substrate and then the SiC substrate is rotated around a perpendicular line of the surface as a rotation shaft, which can make the resist uniform (spin coating process). Then, the carbon cap is formed by carbonizing the resist. Formation of the carbon cap can suppress the surface roughening of the SiC substrate which is occurred during ion activation treatment. After ion activation treatment, the treatment for removing the carbon cap is needed.

PRIOR-ART DOCUMENTS

Non-Patent Documents

NON-PATENT DOCUMENT 1: "1700V/3.5 mΩcm$^2$ V-groove trench MOSFETs with high threshold voltage", SiC and relevant semiconductor study group 22th conference proceedings, The Japan Society of Applied Physics, Dec. 9, 2013, p. 21-22

SUMMARY OF THE INVENTION

Problems to be Solved by the Invention

However, in a SiC substrate having grooves, a resist is not uniformly applied even in using a spin coating process because of the grooves as an obstacle. Therefore, in the substrate having the grooves, the surface of the SiC substrate is roughened by ion implantation and ion activation treatment even in using the carbon cap method. This may lead to a case that an appropriate semiconductor element cannot be manufactured. In the carbon cap method, since processes for forming and removing the carbon cap are needed, a step of manufacturing the semiconductor element is complicated.

The present invention has been made in view of the circumstances described above, and a primary object of this invention is to provide a SiC substrate treatment method for, with respect to a SiC substrate having grooves formed thereon, activating ions while preventing occurrence of a surface roughness.

Means for Solving the Problems and Effects Thereof

Problems to be solved by the present invention are as described above, and next, means for solving the problems and effects thereof will be described.

In an aspect of the present invention, provided is a SiC substrate treatment method for, with respect to a SiC substrate that has, on its surface, an ion implantation region in which ions are implanted and has grooves provided in a region including at least the ion implantation region, performing an ion activation treatment in which the SiC substrate is heated under Si vapor pressure thereby activating ions that are implanted in the SiC substrate while etching the surface of the SiC substrate.

Accordingly, when the SiC substrate is heated under Si vapor pressure, unlike when using the spin coating process, the grooves are less likely to obstruct (since there is gas, such heat treatment acts uniformly even if the grooves are existing). Therefore, the ions can be activated while preventing a surface roughening (rather while planarizing) even in the SiC substrate having the grooves. Thus, a high-quality semiconductor element can be manufactured with the SiC substrate having the grooves. In the ion activation treatment of the present invention, unlike the spin coating process, a manufacturing step can be simplified since a step of forming and removing a carbon cap is unnecessary. Furthermore, the surface of the SiC substrate can be etched by performing the ion activation treatment of the present invention, which can also remove a region where implanted ions are insufficient, with the same treatment.

In the SiC substrate treatment method, it is preferable that the grooves formed on the SiC substrate are grooves for isolating the SiC substrate.

Accordingly, the plurality of high-quality semiconductor elements can be manufactured with the SiC substrate having the grooves.

In the SiC substrate treatment method, an ion implantation treatment for implanting ions in a SiC substrate that has, on its surface, an epitaxial layer of a single crystal SiC and has the grooves provided at least on the epitaxial layer, is preferably performed prior to the ion activation treatment.

Accordingly, since an ion distribution can be assumed depending on conditions of ion implantation, the surface of the SiC substrate can be removed only for necessary and sufficient amount.

In the SiC substrate treatment method, it is preferable that the ion activation treatment is performed under Si and inert gas atmosphere at the pressure of 10 Pa or more and 100 kPa or less.

Accordingly, since the rate of etching can be suppressed by increasing the pressure with inert gas, the amount of etching on the surface of the SiC substrate can be accurately controlled.

In the SiC substrate treatment method, it is preferable that the ion activation treatment is performed at $10^{-7}$ Pa or more and $10^{-2}$ Pa or less.

Accordingly, since the rate of etching can be increased by performing the ion activation treatment under high-vacuum, a treatment time can be reduced when the implanted ions are located at a deep position of the SiC substrate, for example.

It is preferable that the ion activation treatment is performed under Si and inert gas atmosphere, at the pressure of $10^{-2}$ Pa or more and 10 Pa or less.

Accordingly, since the rate of etching can be adjusted by adjusting an inert gas pressure, the amount of etching on the surface of the SiC substrate can be controlled to an appropriate amount.

The SiC substrate treatment method is preferably configured as follows. That is, the ion activation treatment is performed in a state where the SiC substrate is positioned at an internal space of a heat treatment container. The heat treatment container includes a tantalum metal, and has a tantalum carbide layer provided on the internal space side of the tantalum metal, and a tantalum silicide layer provided on the side further toward the internal space than the tantalum carbide layer.

Accordingly, since the pressure of Si within a storing container can be uniform, the etching on the surface of the SiC substrate can be uniformly performed.

EMBODIMENT FOR CARRYING OUT THE INVENTION

Next, an embodiment of the present invention will be described with reference to the drawings.

Figure 1:
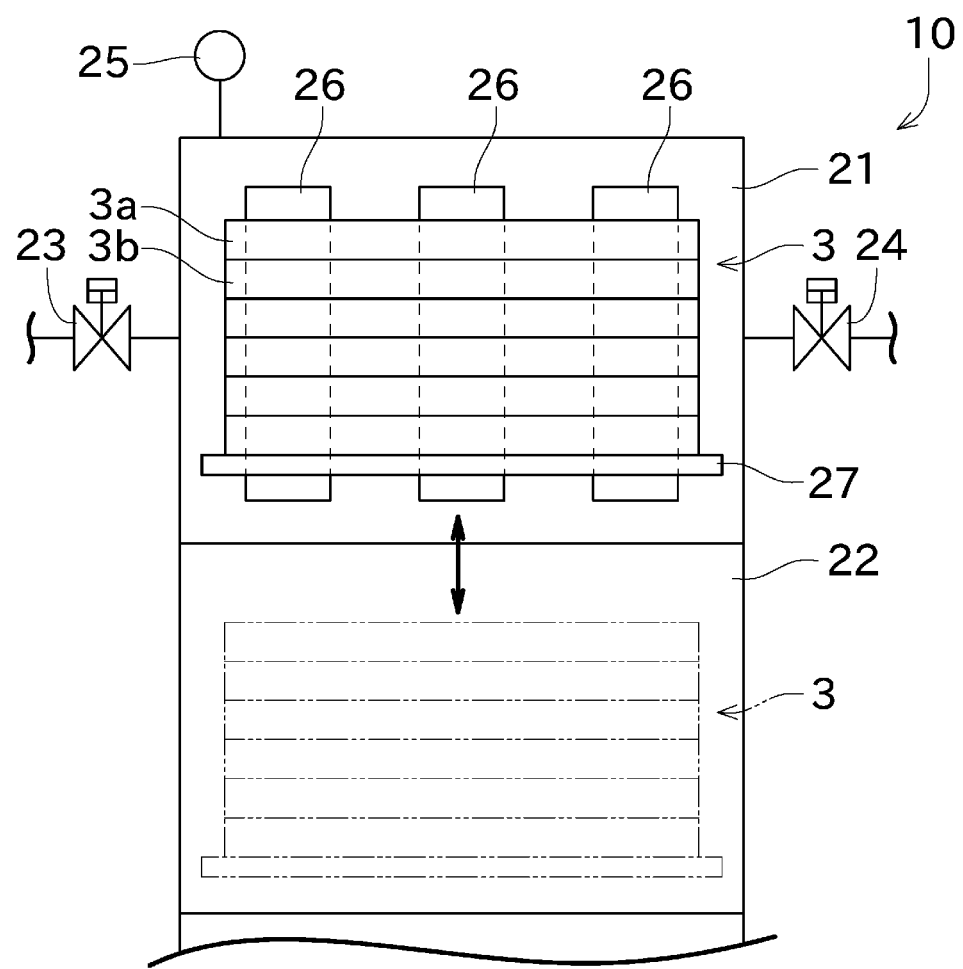
FIG. 1 is a diagram for illustration of an outline of a high temperature vacuum furnace for use in a heat treatment according to the present invention.
Figure 2:
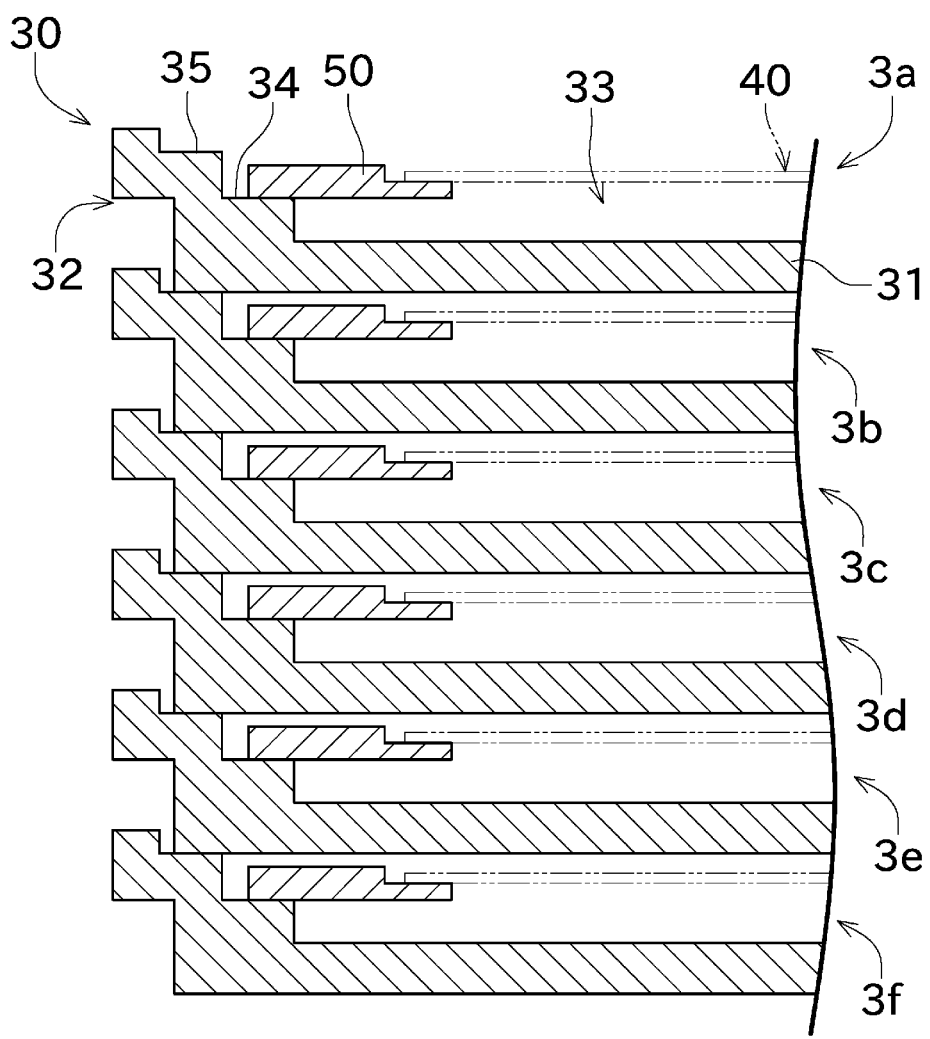
FIG. 2 an end view of a heat treatment container.

Firstly, referring to FIG. 1, a high temperature vacuum furnace 10 used for a heat treatment of this embodiment will be described. FIG. 1 is a diagram for illustration of an outline of a high temperature vacuum furnace 10 for use in a surface treatment method according to the present invention. FIG. 2 is an end view of a heat treatment container 3.

As shown in FIG. 1, the high temperature vacuum furnace 10 includes a main heating chamber 21 and a preheating chamber 22. The main heating chamber 21 is configured to heat a SiC substrate made of, at least in its surface, single crystal SiC, up to a temperature of 1000° C. or more and 2300° C. or less. The preheating chamber 22 is a space for preheating a SiC substrate prior to heating of the SiC substrate in the main heating chamber 21.

A vacuum-forming valve 23, an inert gas injection valve 24, and a vacuum gauge 25 are connected to the main heating chamber 21. The vacuum-forming valve 23 is configured to adjust the degree of vacuum of the main heating chamber 21. The inert gas injection valve 24 is configured to adjust the pressure of an inert gas (for example, Ar gas) contained in the main heating chamber 21. The vacuum gauge 25 is configured to measure the degree of vacuum of the interior of the main heating chamber 21.

Heaters 26 are provided in the main heating chamber 21. A heat reflection metal plate (not shown) is secured to a side wall and a ceiling of the main heating chamber 21. The heat reflection metal plate is configured to reflect heat of the heaters 26 toward a central region of the main heating chamber 21. This provides strong and uniform heating of a SiC substrate 40, to cause a temperature rise up to 1000° C. or more and 2300° C. or less. Examples of the heaters 26 include resistive heaters and high-frequency induction heaters.

The SiC substrate 40 is stored in the heat treatment container 3. The heat treatment container 3 includes storing parts 3a to 3f. Each of the storing parts 3a to 3f is configured to support the SiC substrate 40 one by one. The heat treatment container 3 is placed on a work table 27. The work table 27 is movable at least from the preheating chamber 22 to the main heating chamber 21 by means of a driving device and a transmission mechanism (not shown).

To perform heat treatment of the SiC substrate 40, the heat treatment container 3 is firstly placed in the preheating chamber 22 of the high temperature vacuum furnace 10 as indicated by the dot-dash lines in FIG. 1, and preheated at an appropriate temperature (for example, about 800° C.). Then, the heat treatment container assembly 3 is moved to the main heating chamber 21 whose temperature has been elevated to a set temperature (for example, about 1800° C.) in advance. Then, the SiC substrate 40 is heated while adjusting the pressure or the like. The preheating may be omitted.

Next, the heat treatment container 3 will be described. As shown in FIG. 2, the heat treatment container 3 includes the storing parts 3a to 3f stacked in a vertical direction. Since all of the storing parts 3a to 3f have the same shape, the storing part 3a will be described as a representative.

As shown in FIG. 2, the storing part 3a that supports one SiC substrate 40 is a portion for heating the SiC substrate 40 under Si vapor pressure. The storing part 3a includes a container part 30 and a substrate holder 50.

The container part 30 is a cylindrical container with a bottom, and its axial length is short. The container part 30 has an internal space 33 that is defined by inner walls of a bottom surface portion 31 and a side surface portion 32. The internal space 33 is a space whose upper side is open.

The side surface portion 32 is provided with a first step 34 and a second step 35. The first step 34 supports an outer edge portion of the substrate holder 50. The second step 35 supports the storing part stacked thereon.

The substrate holder 50 is supported by the first step 34 of the container part 30. The substrate holder 50 supports the SiC substrate 40 so as to make the surface to be treated face the internal space (that is, so as to make the surface to be treated face downward).

Accordingly, since an upper opening side of the internal space 33 can be covered by the substrate holder 50 and the SiC substrate 40, the internal space 33 is a hermetically sealed space. Thus, it is unnecessary to seal the container part 30 with a lid or the like. In addition, the surface to be treated faces downward, which can avoid a situation in which fine impurities drop onto the surface to be treated of the SiC substrate 40.

Next, a composition of a wall surface of the heat treatment container 3 will be described with reference to FIG. 3. FIG.

3 is a schematic view showing the composition of the wall surface of the heat treatment container 3.

Figure 3:
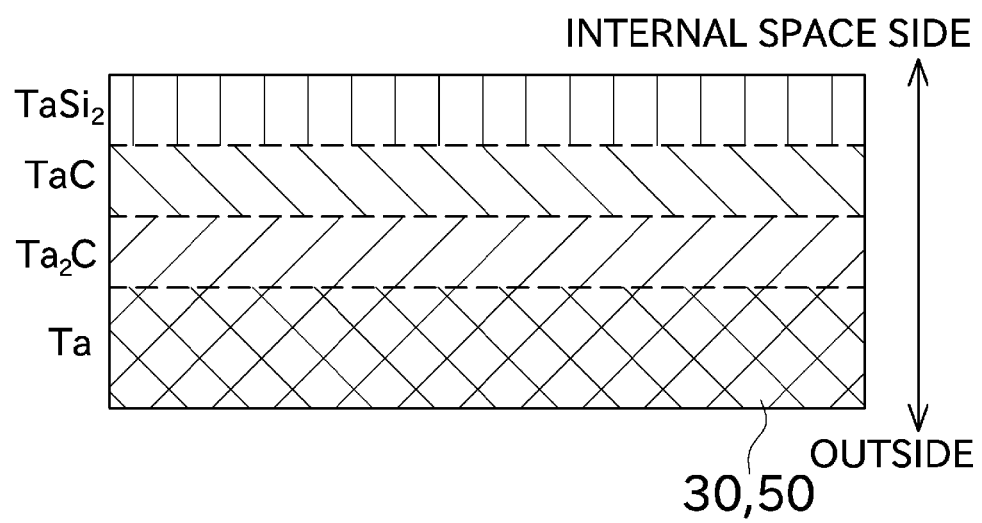
FIG. 3 ia a schematic view showing a composition of a wall surface of the heat treatment container.

The heat treatment container 3, at least in an area constituting a wall surface of the internal space 33, has the composition shown in FIG. 3. More specifically, a tantalum layer (Ta), tantalum carbide layers (TaC and Ta$_2$C), and a tantalum silicide layer (TaSi$_2$) are provided in this order from the outside toward the internal space 33 side.

A crucible including the tantalum layer and the tantalum carbide layer has been conventionally known. In this embodiment, the tantalum silicide layer is additionally formed. The tantalum silicide layer is for applying Si vapor pressure in the internal space 33. Instead of a composition in which the tantalum silicide layer is provided on the inner wall surface of the heat treatment container 3, solid Si may be arranged within the heat treatment container 3.

A method for forming the tantalum silicide layer will be briefly described below. The tantalum silicide layer is formed by bringing molten Si into contact with the inner wall surface of the crucible and heating it at about 1800° C. or more and 2000° C. or less. Thereby, the tantalum silicide layer made of TaSi$_2$ is formed. In this embodiment, the tantalum silicide layer having a thickness of about 30 μm to 50 μm is formed. Depending on the volume of the internal space, etc., the tantalum silicide layer having a thickness of, for example, 1 μm to 300 μm may be formed.

The tantalum silicide layer can be formed through the above-described process. Although this embodiment adopts TaSi$_2$ as tantalum silicide, tantalum silicide represented by other chemical formula may be also adoptable. A plurality of types of tantalum silicide laminated one on another is also acceptable.

In this embodiment, the tantalum silicide layer is provided over an entire wall surface (a side wall, a bottom surface, and an upper surface other than the SiC substrate 40) that defines the internal space 33. This allows Si pressure in the internal space 33 to be uniform.

Figure 4A:
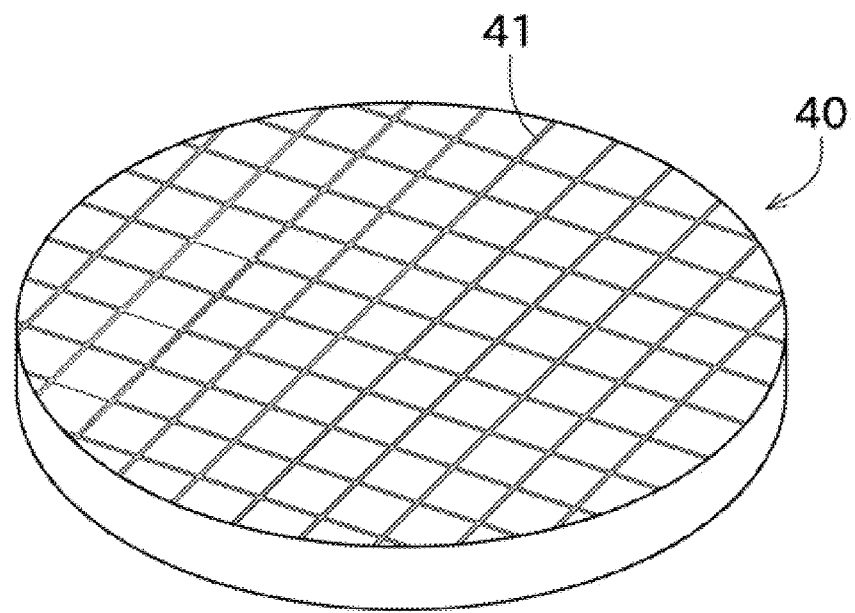
FIGS. 4A and 4B are a perspective view and a schematic cross-sectional view, respiectively, of a SiC substrate having grooves.
Figure 4B:
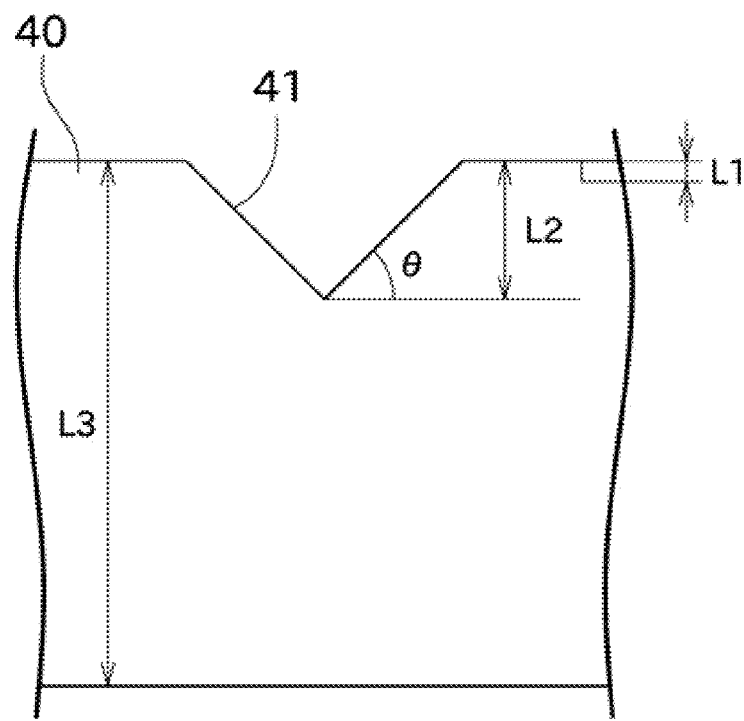

Next, the SiC substrate 40 having grooves, which is an object to be treated will be described with reference to FIGS. 4A and 4B. FIGS. 4A and 4B are a perspective view and a schematic cross-sectional view, respectively, of the SiC substrate 40 having grooves 41.

As shown in FIG. 4A, the SiC substrate 40 has a disk-like shape. The SiC substrate 40 has the plurality of grooves 41. The grooves 41 are formed vertically and horizontally so as to divide the surface of the SiC substrate 40 into a plurality of squares. Any intervals for providing the grooves is adoptable since it depends on the size of the semiconductor element. The interval can be set to 4 mm, for example. The SiC substrate 40 may be a substrate having an off angle. The off angle may be 0°. The grooves 41 may have any shapes, such as a rectangular shape cross section or a Ω shape cross section as long as an opening portion is provided. Any depth of the grooves 41 and any ratio between the opening portion and the depth (aspect ratio) are also adoptable. The preferred aspect ratio (the depth of the opening portion/the length of the opening portion) is 0.5 to 20.

As shown in FIG. 4B, the grooves 41 of this embodiment have V-shape. An angle θ defined by the surface of the SiC substrate 40 and the grooves 41 is 45°. Any shapes of the grooves and any values θ are adoptable. An epitaxial layer made of single crystal SiC is provided on the surface of the SiC substrate 40 (for example, (0001) Si-face or (000-1) C-face). In FIG. 4B, the thickness of the epitaxial layer is represented by a reference numeral L1. The distance between the surface of the SiC substrate 40 and the deepest portion of the grooves 41 is represented by a reference numeral L2. In this embodiment, the depth (L2) of the grooves is several times larger than the thickness (L1) of the epitaxial layer. In FIG. 4B, the thickness of the SiC substrate 40 is represented by a reference numeral L3. In this embodiment, the depth (L2) of the grooves is a fraction of the thickness (L3) of the SiC substrate 40.

Next, a process for manufacturing a semiconductor element from the SiC substrate 40 with the high temperature vacuum furnace 10 and the heat treatment container 3 will be described with reference to FIGS. 5A through 5E. FIGS. 5A through 5E are drawings schematically showing situations of the SiC substrate in each step. The grooves 41, an epitaxial layer 45, and an ion implantation region 46 of the SiC substrate in FIG. 5 are represented with the size different from an actual thickness (depth) for clarity of the drawing.

Figure 5A:
FIGS. 5A through 5E are drawings schematically showing situations of the SiC substrate in each step.

FIG. 5A shows the SiC substrate 40 before the treatment. As described above, the SiC substrate 40 has the plurality of grooves 41 and the epitaxial layer 45. CVD process (chemical vapor deposition) or MSE process (metastable solvent epitaxy) can be used as a method for forming the epitaxial layer 45. The grooves 41 are formed by using a diamond tool, a laser, or the like.

Figure 5B:
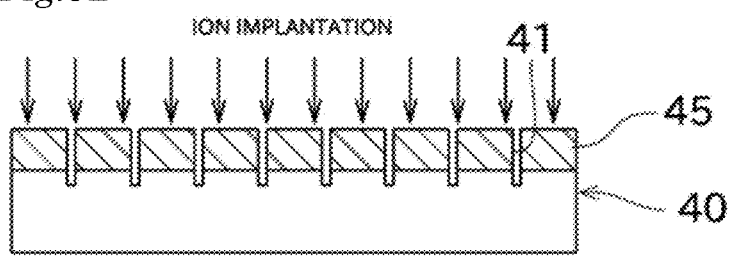

Firstly, as shown in FIG. 5B, ion implantation is performed to the SiC substrate 40. The ion implantation is performed by using ion implantation apparatus having a function for ion-irradiating an object. The ion implantation apparatus implants ions (aluminum ions, or the like) as impurities into the entire surface of the epitaxial layer 45 or into a selective part of the surface of the epitaxial layer 45.

Figure 5C:
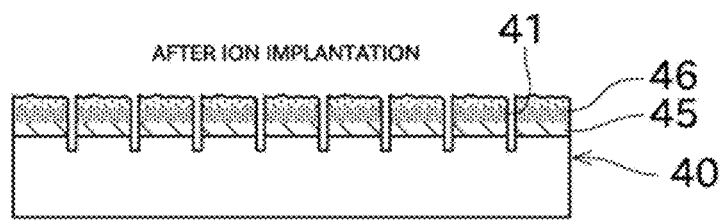

As shown in FIG. 5C, the ion implantation region 46 is provided on the SiC substrate 40 by implanting ions. A desired region of a semiconductor element is provided based on the ion implantation region 46. As a result of the ion implantation, the surface of the epitaxial layer 45 containing the ion implantation region 46 is roughened (the surface of the SiC substrate 40 is damaged, so that the flatness is deteriorated). In general, there is a region having insufficient ion concentration near the surface of the ion implantation region 46, although it depends on the energy of the implanted ions, etc.

Figure 5D:
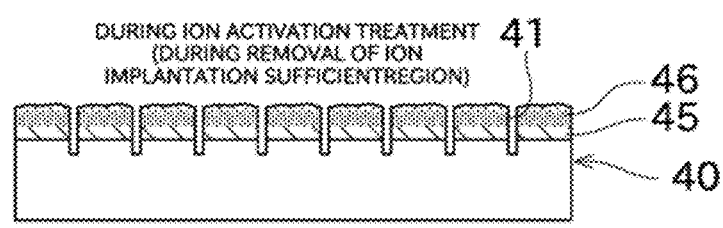

Next, as shown in FIG. 5D, an activation of the implanted ions and the etching of the ion implantation region 46 are performed. In this embodiment, these two processes can be performed in a single step. More specifically, a heat treatment is performed under Si vapor pressure at a temperature of 1500° C. or more and 2200° C. or less, and desirably 1600° C. or more and 2000° C. or less. This can activate the implanted ions. The ion activation treatment of this embodiment is performed under Si and inert gas atmosphere.

Figure 5E:
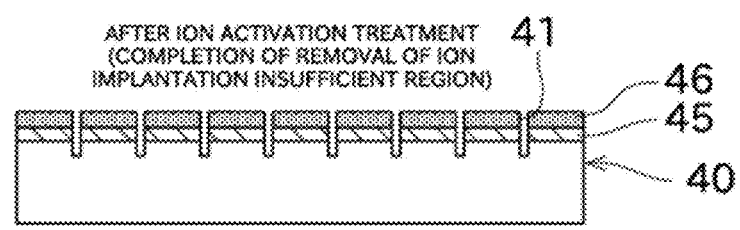

Additionally, the surface of the SiC substrate 40 is etched with the above-described condition so that roughened region of the ion implantation region 46 are planarized (see FIG. 5E. To be etched (planarized), the following reactions are performed. Briefly, as a result of heating the SiC substrate 40 under Si vapor pressure, SiC of the SiC substrate 40 is sublimated into Si$_2$C or SiC$_2$, and Si under Si atmosphere and C are bonded on the surface of the SiC substrate 40. This leads to self-organization and planarization of the surface. Furthermore, Si released by heating, from the inner wall surface having the tantalum silicide layer in the heat treatment container 3 is contributed to the above-described reactions.

$$SiC(s) \rightarrow Si(v)I + C(s)I \tag{1}$$

$$2SiC(s) \rightarrow Si(v)II + SiC_2(v) \tag{2}$$

$$Ta_xSi_y(s) \rightarrow Ta_xSi_{y-1} + Si(v)III \tag{3}$$

$$SiC(s)+Si(v)I+II+III \to Si_2C(v) \quad (4)$$

$$C(s)I+2Si(v)I+II+III \to Si_2C(v) \quad (5)$$

As described above, as a result of the ion activation treatment (heat treatment), ion activation by heating at a high-temperature, removal of the region having insufficient ion concentration of the surface of the ion implantation region 46, and planarization of the surface of the SiC substrate 40 can be performed.

In this embodiment, Si as a gas acts on the SiC substrate 40. Unlike a resist used in spin coating process, Si as a gas uniformly acts to the inside of the grooves 41 of the SiC substrate 40. Therefore, the SiC substrate 40 having the grooves 41 can be successfully etched and planarized.

Figure 6:
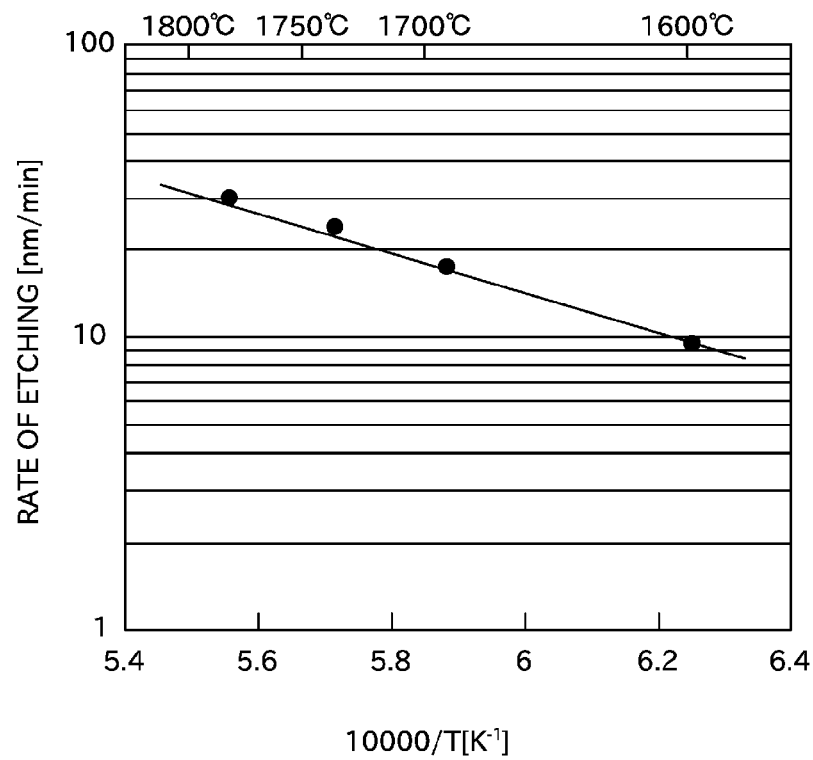
FIG. 6 is a graph showing a relationship between a heating temperature and a rate of etching.

Next, a relationship between the inert gas pressure and the rate of etching will be described with reference to FIG. 6 and FIG. 7.

As conventionally known, the rate of etching depends on the heating temperature. FIG. 6 is a graph showing the rate of etching in cases where the heating temperature was set to 1600° C., 1700° C., 1750° C., and 1800° C. The graph shows that the rate of etching is higher as the heating temperature is higher. The horizontal axis of the graph represents the reciprocal of the temperature, and the vertical axis of the graph logarithmically represents the rate of etching. As shown in FIG. 6, the graph is linear. This makes it possible to, for example, estimate the rate of etching that will be grasped if the heating temperature is changed.

Figure 7:
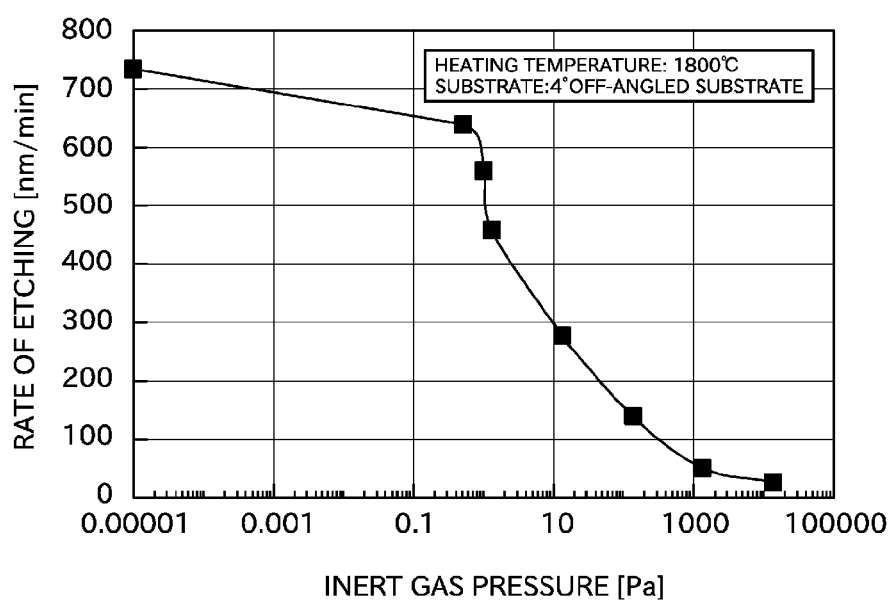
FIG. 7 is a graph showing a relationship between an inert gas pressure and a rate of etching.

FIG. 7 is a graph showing a relationship between the inert gas pressure and the rate of etching. The graph shows that the rate of etching is lower as the inert gas pressure is higher. The rate of etching can be accurately grasped by increasing the inert gas pressure and decreasing the rate of etching. For example, at a heating temperature of 1800° C., the pressure is set to 10 Pa or more, which can result in the rate of etching at about 300 nm/min or less. The pressure is set to 100 Pa or more, which can result in the rate of etching at about 100 nm/min or more. The rate of etching is accordingly changed in a case where the heating temperature is other than 1800° C. However, even if such situation is taken into consideration, the amount of etching can be accurately grasped by setting the pressure to 10 Pa or more. Therefore, only the region having insufficient ion concentration can be accurately removed. Since the treatment of this embodiment is not performed over normal pressure, the pressure is preferably set to 100 kPa or less. On the other hand, for example, when the energy of implanted ions is high, the region having insufficient ion concentration is relatively deep. Therefore, the rate of etching is relatively high by decreasing the inflow of the inert gas, for example, setting to $10^{-2}$ Pa or more and 10 Pa or less. This can suppress time of treatment for removing the region having insufficient ion concentration.

Next, the experiment in which the applicant performed for confirming the effect of the present invention will be described. The SiC substrate 40 used in the experiment had the grooves 41 having V-shape and the angle θ defined by the surface of the SiC substrate 40 and the grooves 41 was 45°. The depth (L2) of the grooves 41 was 100 μm, and the thickness (L3) of the SiC substrate 40 was 380 μm. The interval between the grooves 41 was 4 mm to 5 mm.

Figure 8A:
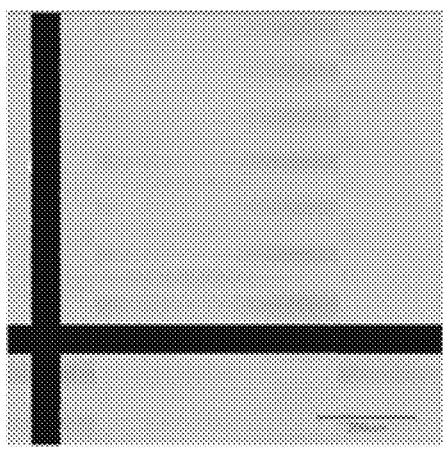
FIGS. 8A and 8B are photographs showing a situation of a surface of the SiC substrate before and after spin coating.
Figure 8B:

A resist (OFPR-800 made by TOKYO OHKA KOGYO Co., Ltd.) having a coating thickness of 1 μm was applied on the SiC substrate 40, and then spin coating was performed at 5000 rpm. FIGS. 8A through 8B each shows the photograph of the surface of the SiC substrate 40. FIG. 8A shows a state before spin coating of the resist. FIG. 8B shows a state after spin coating of the resist. In FIG. 8, the black areas are the grooves 41. After the application of the resist (FIG. 8B), coating unevenness of the resist was remarkably appeared and therefore it could not be used for practical use.

As described above, the SiC substrate treatment method of this embodiment is for, with respect to the SiC substrate 40 that has, on its surface, the ion implantation region 46 in which ions are implanted and has the grooves 41 provided in a region including at least the ion implantation region 46, performing an ion activation treatment in which the SiC substrate 40 is heated under Si vapor pressure thereby activating ions that are implanted in the SiC substrate 40 while etching the surface of the SiC substrate 40.

Accordingly, when heating under Si vapor pressure, unlike when using the spin coating process, the grooves 41 are less likely to obstruct (since there is gas, such heat treatment acts uniformly even if the grooves are existing.). Therefore, the ions can be activated while preventing the surface roughness (rather while planarizing) even in the SiC substrate 40 having the grooves 41. Thus, a high-quality semiconductor element can be manufactured with the SiC substrate 40 having the grooves 41. In the ion activation treatment of the present invention, unlike the spin coating process, a manufacturing step can be simplified since a step of forming and removing a carbon cap is unnecessary. Furthermore, since the surface of the SiC substrate 40 can be etched by performing the ion activation treatment of the present invention, a region having an insufficient ion concentration can be also removed at the same time.

In the SiC substrate treatment method of this embodiment, the grooves 41 provided on the SiC substrate 40 are grooves for isolating the SiC substrate 40.

Accordingly, a plurality of high-quality semiconductor elements can be manufactured with the SiC substrate 40 having the grooves 41.

In the SiC substrate treatment method of this embodiment, the ion implantation treatment for implanting ions in the SiC substrate 40 that has, on its surface, the epitaxial layer 45 of a single crystal SiC and has the grooves 41 provided at least on the epitaxial layer 45, is preferably performed prior to the ion activation treatment.

Accordingly, since an ion distribution can be assumed depending on conditions of ion implantation, the surface of the SiC substrate 40 can be removed only for necessary and sufficient amount.

Although a preferred embodiment of the present invention has been described above, the above-described configuration can be modified, for example, as follows.

In the above-described embodiment, although the treatment is performed with respect to the SiC substrate 40 having the grooves 41 for the purpose of isolation of a semiconductor element, a method of this embodiment can be applied even if the grooves are formed for other purpose. The grooves provided for other purpose are, for example, grooves for embedding a MOSFET gate (grooves further smaller than the grooves 41 of this embodiment).

In the above-described embodiment, although the ion activation treatment is performed under Si and inert gas atmosphere, the ion activation treatment may be performed under Si atmosphere without flowing inert gas. In this case, the ion activation treatment can be performed at a general rate of etching by setting the pressure to $10^{-7}$ Pa or more and $10^{-2}$ Pa or less (desirably $10^{-4}$ Pa or less).

In the above-described embodiment, although the heat treatment container in which the storing parts are stacked is used, a heat treatment container in which the storing parts cannot be stacked may be used. Any directions for arranging the SiC substrate may be adoptable, and the surface to be treated may face upward.

DESCRIPTION OF THE REFERENCE NUMERALS 3 heat treatment container
10 high temperature vacuum furnace
40 SiC substrate
41 groove
45 epitaxial layer
46 ion implantation region

The invention claimed is:

1. A SiC substrate treatment method for, with respect to a SiC substrate that has, on its surface, an ion implantation region in which ions are implanted and has grooves provided in a region including at least the ion implantation region, performing an ion activation treatment in which the SiC substrate is heated under Si vapor pressure thereby activating ions that are implanted in the SiC substrate while etching the surface of the SiC substrate.

2. The SiC substrate treatment method according to claim 1, wherein
the ion activation treatment is performed in a state where the SiC substrate is positioned at an internal space of a heat treatment container,
the heat treatment container includes a tantalum metal, and has a tantalum carbide layer provided on the internal space side of the tantalum metal, and a tantalum silicide layer provided on the side further toward the internal space than the tantalum carbide layer.

3. The SiC substrate treatment method according to claim 1, wherein
the grooves provided on the SiC substrate are grooves for isolating the SiC substrate.

4. The SiC substrate treatment method according to claim 3, wherein
the ion activation treatment is performed in a state where the SiC substrate is positioned at an internal space of a heat treatment container,
the heat treatment container includes a tantalum metal, and has a tantalum carbide layer provided on the internal space side of the tantalum metal, and a tantalum silicide layer provided on the side further toward the internal space than the tantalum carbide layer.

5. The SiC substrate treatment method according to claim 1, wherein
an ion implantation treatment for implanting ions in a SiC substrate that has, on its surface, an epitaxial layer of a single crystal SiC and has grooves provided at least on the epitaxial layer, is performed prior to the ion activation treatment.

6. The SiC substrate treatment method according to claim 5, wherein
the ion activation treatment is performed in a state where the SiC substrate is positioned at an internal space of a heat treatment container,
the heat treatment container includes a tantalum metal, and has a tantalum carbide layer provided on the internal space side of the tantalum metal, and a tantalum silicide layer provided on the side further toward the internal space than the tantalum carbide layer.

7. The SiC substrate treatment method according to claim 1, wherein
the ion activation treatment is performed under Si and inert gas atmosphere, at a total Si and inert gas pressure of 10 Pa or more and 100 kPa or less.

8. The SiC substrate treatment method according to claim 7, wherein
the ion activation treatment is performed in a state where the SiC substrate is positioned at an internal space of a heat treatment container,
the heat treatment container includes a tantalum metal, and has a tantalum carbide layer provided on the internal space side of the tantalum metal, and a tantalum silicide layer provided on the side further toward the internal space than the tantalum carbide layer.

9. The SiC substrate treatment method according to claim 1, wherein
the ion activation treatment is performed at $10^{-7}$ Pa or more and $10^{-2}$ Pa or less.

10. The SiC substrate treatment method according to claim 9, wherein
the ion activation treatment is performed in a state where the SiC substrate is positioned at an internal space of a heat treatment container,
the heat treatment container includes a tantalum metal, and has a tantalum carbide layer provided on the internal space side of the tantalum metal, and a tantalum silicide layer provided on the side further toward the internal space than the tantalum carbide layer.

11. The SiC substrate treatment method according to claim 1, wherein
the ion activation treatment is performed under Si and inert gas atmosphere, at a total Si and inert gas pressure of $10^{-2}$ Pa or more and 10 Pa or less.

12. The SiC substrate treatment method according to claim 11, wherein
the ion activation treatment is performed in a state where the SiC substrate is positioned at an internal space of a heat treatment container,
the heat treatment container includes a tantalum metal, and has a tantalum carbide layer provided on the internal space side of the tantalum metal, and a tantalum silicide layer provided on the side further toward the internal space than the tantalum carbide layer.

* * * * *